United States Patent [19]
Ganev

[11] Patent Number: 4,602,592
[45] Date of Patent: Jul. 29, 1986

[54] APPARATUS FOR CARRYING OUT LIQUID PHASE EPITAXY GROWTH

[75] Inventor: Tsviatko S. Ganev, Upsala, Sweden

[73] Assignee: Telefonaktiebolaget LM Ericsson, Stockholm, Sweden

[21] Appl. No.: 626,877

[22] PCT Filed: Nov. 11, 1983

[86] PCT No.: PCT/SE83/00393
§ 371 Date: Jun. 29, 1984
§ 102(e) Date: Jun. 29, 1984

[87] PCT Pub. No.: WO84/01968
PCT Pub. Date: May 24, 1984

[30] Foreign Application Priority Data
Nov. 12, 1982 [SE] Sweden ............................. 8206432

[51] Int. Cl.$^4$ ........................................ H01L 21/208
[52] U.S. Cl. ..................................... 118/412; 118/415
[58] Field of Search .................... 118/412, 415, 429; 148/171, 172; 156/622, 624

[56] References Cited
U.S. PATENT DOCUMENTS 4,028,148 6/1977 Horikoshi .
4,338,877 7/1982 Yamanaka et al. ............. 148/171 X
4,357,897 11/1982 Leswin ............................ 118/415 X

FOREIGN PATENT DOCUMENTS 0362986 12/1973 Sweden .
2070455 9/1981 United Kingdom .
2074469 11/1981 United Kingdom .

OTHER PUBLICATIONS

Blum et al., Liquid Phase Epitaxy Growth of DH Laser Arrays, IBM Technical Disclosure Bulletin, vol. 15, No. 7 Dec. 1972, p. 2091.

Primary Examiner—John P. McIntosh
Attorney, Agent, or Firm—Roberts, Spiecens & Cohen

[57] ABSTRACT

Apparatus for carrying out liquid phase epitaxy growth comprising a melt holder having a predetermined number of cells for liquid phase melts for growing a number of epitaxial layers on a horizontally disposed substrate. The substrate is supported by a holder which is displaceable in order to bring the substrate into successive contact with the melts. A melt filler is disposed above the melt holder and contains a number of compartments corresponding to the number of cells in the melt holder and of greater volume than that of the cells for storing batches corresponding to several melts, the melts being supplied from the compartments to the cells through a displaceable perforated plate. A melt collector is arranged beneath the melt holder for collecting the melts from the cells. The melt holder has a displaceable bottom which undergoes displacement by the substrate holder and after the growth of each layer from the respective melt, the substrate holder is retracted to allow the melt in the associated cells to be deposited into the respective compartments of the melt collector. The melt collector and melt filler are substantially identical so that after the melt filler has been emptied, it can change places with the melt collector to immediately repeat the epitaxy growth process.

4 Claims, 5 Drawing Figures

APPARATUS FOR CARRYING OUT LIQUID PHASE EPITAXY GROWTH

FIELD OF THE INVENTION

The present invention relates to apparatus for carrying out liquid phase epitaxy growth where, a predetermined number of melts are heated in a first step and where, in a second step a substrate is moved into successive contact with the melts for growing a number of epitaxial layers on the substrate corresponding to the number of melts.

BACKGROUND

A method and apparatus for liquid phase epitaxy growth is known, e.g. from the Swedish Patent Specification 363 986. In the apparatus illustrated in FIG. 8 and FIG. 9 in this specification the very severe purity demands placed on the grown epitaxial layers which are to be used in lasers and optical detectors are not fulfilled. In moving the substrate between the melts, drops of melt can fasten on the edges of the substrate or in certain defects, e.g. crystalline holes, on the substrate and be transferred to the next melt which thus becomes contaminated.

In the process described in the above-mentioned Swedish Patent Specification, the substrate is adjacent the melt holder during the entire time required for heating the melts, which causes thermal erosion in the substrate.

In the illustrated apparatus, the substrate holder with the substrate cannot be drawn back, after completed growth of all the desired layers, for beginning the growth of a new substrate, and it is necessary to wait until these melts in the melt holder have solidified so as not to contaminate the melts.

SUMMARY OF THE INVENTION

The object of the present invention is to provide an apparatus for liquid phase epitaxy in which the very severe purity demands on the epitaxial layers for lasers and optical detectors are fulfilled, while at the same time the growth of a new substrate can be started directly after the growth of the preceding substrate has been terminated.

This is achieved by the apparatus in accordance with the invention comprising a melt holder having a predetermined number of cells, each for receiving a melt, for growing on a horizontally disposed substrate a number of epitaxial layers corresponding to the number of melts, a displaceable substrate holder disposed under the melt holder and supporting said substrate to bring the substrate successively in contact with respective melts, a melt filler disposed above said melt holder and having a number of compartments corresponding to the number of cells of the melt holder, said compartments being of greater volume than that of the cells for storing batches in the compartments corresponding to several melts in the cells, a perforated plate disposed between the melt filler and the melt holder for controlling communication between said compartment and the respective cells, said plate being displaceable to a position to bring its perforations into communication with said compartments and with said cells for filling of said cells from said compartments, and a melt collector under said melt holder, said melt collector including a number of compartments corresponding to the number of cells in said holder for receiving melt from said cells, said melt holder and perforated plate being disposed between said melt filler and said melt collector, said melt holder including a bottom which is displaceable by said substrate holder, said compartments in said melt collector being of greater volume than that of said cells for collecting several melts from respective cells, said substrate holder being displaceable forwardly to bring the substrate successively into contact with the respective melts and also being displaceable backwardly a distance, after growth has taken place in contact with each melt, to form an intermediate space between said substrate holder and said displaceable bottom of the melt holder through which space the respective melt can flow into the associated compartment in said melt collector before the substrate holder is displaced forwardly to bring the substrate under the next melt in the melt holder, said melt filler and melt collector being substantially identical so that after the melt filler is emptied, it can be interchanged with the melt collector for substantially immediately repeating the epitaxy growth process.

BRIEF DESCRIPTION OF THE DRAWINGS

The invention will now be described below with reference to the appended drawing, in which.

DETAILED DESCRIPTION OF A BEST MODE FOR CARRYING OUT THE INVENTION

Figure 1:
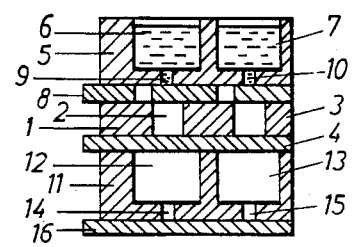
FIGS. 1, 2, 3, 4 and 5 illustrate different stages in a growing sequence in apparatus in accordance with the invention.

FIG. 1 is a sectional view of an apparatus in accordance with the invention for liquid phase epitaxy, before the growth of a substrate has been started. A melt holder, e.g. of graphite, is denoted by the numeral 1 and has a predetermined number of cells, of which only two 2 and 3 are shown. The cells 2 and 3 are open upwards, while below they are closed off by means of a displaceable bottom 4, also of graphite, and common to all the cells in the melt holder. Each of the cells is intended to receive a melt for growing a number of epitaxial layers corresponding to the number of melts on a substrate not illustrated in FIG. 1, which is displaceable under the melt holder 1 for bringing the substrate into contact with the respective melt.

In conjunction with lasers and optical detectors, the substrate may consist either of gallium arsenide or indium arsenide or indium phosphide, while the melts consist of corresponding material with other electrical and optical properties obtained by doping with different substances.

In the process step illustrated in FIG. 1, the melts are assumed to be heated to saturation temperature in a melt filler 5, made from graphite, arranged above the melt holder 1, and having a number of compartments corresponding to the number of cells in the melt holder 1, only two of these compartments 6 and 7 being illustrated in FIG. 1. These compartments have greater volume than the cells in the melt holder 1, for accommodating melt batches in the melt filler 5 corresponding to several melts.

A perforated graphite plate 8 is arranged between the filler 5 and holder 1 for filling the cells in the melt holder 1 from the compartments in the melt filler 5, the plate 8 being displaceable for temporarily bringing its perforations into alignment with the respective bottom tap holes 9, 10 of the compartments 6, 7 and cells 2, 3 in the melt holder 1. When the cells 2, 3 have been filled, the plate 8 is once again displaced to cut off communication between the cells in the melt holder 1 and the compartments in the filler 5.

Under the displaceable bottom 4 of the melt holder 1 there is arranged a graphite melt collector 11, which can be identical to the melt filler 5 and, similar to the latter, it has a number of compartments corresponding to the number of cells in the melt holder 1. Two of these compartments 12, 13 are illustrated in FIG. 1 and have the same volume as the compartments 6, 7 in the melt filler 5, i.e. the compartments 12, 13 have greater volume than the cells 2, 3 in the melt holder 1. The compartments 12, 13 in the melt collector 11 are intended for collecting several melts from the cells 2, 3 in the melt holder 1 in a manner which will be explained in detail below. As with the compartments 6, 7 in the filler 5, the compartments 12, 13 in the collector 11 have bottom tap holes 14, 15, which are blanked off with the aid of a graphite bottom plate 16 common for the entire melt collector 11.

In the position illustrated in FIG. 1, the melts in the compartments 6 and 7 are assumed to be heated, either by resistance heating or inductively, with the aid of an unillustrated induction coil. In this connection, the apparatus illustrated in FIG. 1 is mounted in a quartz container, which is either evacuated or filled with a suitable gas, the apparatus according to FIG. 1 extending axially inside the unillustrated induction coil when induction heating is used. During heating of the melts, the substrate (not illustrated in FIG. 1) is at a distance from the heating zone so as not to be subjected to thermal erosion, which would spoil the substrate surface.

Figure 2:
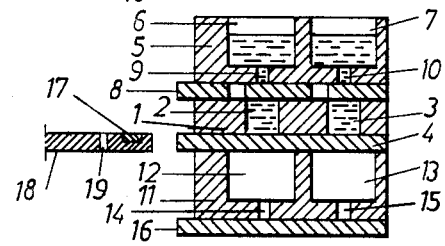

When the melts in the compartments 6 and 7 have been heated to a state of equilibrium for 3-4 hours, the perforated plate 8 is displaced so that is perforations provide communication between the bottom tap holes in the melt filler 5 and the respective cells in the melt holder 1. The cells 2, 3 in the melt holder 1 will then be filled with their melts from the respective compartments 6, 7 in the filler 5, whereafter the plate 8 is once again displaced to its initial position illustrated in FIG. 2 for blocking off communication between the compartments in the filler 5 and the cells in the holder 1.

While the melts in the compartments 6 and 7 in the filler 5 are in the two-phase state, i.e. both solid and liquid phase, the melts in the cells 2 and 3 in the holder 1 are entirely in the liquid phase.

Simultaneously as the cells 2 and 3 in the melt holder 1 are filled, a substrate 17 is displaced with the aid of a substrate holder 18, made from graphite, for example, to a location adjacent the melt holder 1 for adjusting the temperature of the substrate 17 and the substrate holder 18 to the temperature of the melt holder 1. This temperature adjustment takes place during about a quarter of an hour.

Figure 3:
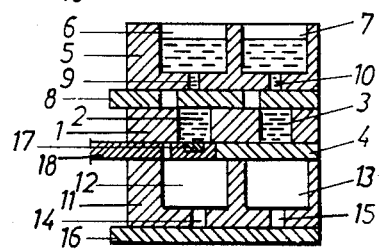

The substrate 17 is then moved by the substrate holder 18 to its first growing position in contact with the one-phase melt in cell 2 in the holder 1, by displacing the bottom 4 of the holder 1 as is apparent from FIG. 3. As will be seen from this Figure, not only is the entire substrate 17 covered by the melt from cell 2 but also a part of the holder 18, for ensuring that the entire substrate really does come into contact with the melt. The substrate 17 is kept in contact with the melt in cell 2 as long as is required for an epitaxial layer of the desired thickness to be grown on the substrate 17.

Before the substrate 17 is subsequently moved into contact with the melt in cell 3 in the holder 1 for growing a new epitaxial layer by further displacement of the displaceable bottom of the holder 1, the melt in cell 2 is tapped off in the melt holder 1 by the substrate holder 18 being pulled backwards a small distance as will be seen from FIG. 4, the melt under pressure in cell 2 then being flushed down into the compartment 12 in the melt collector 1, as will be seen from FIG. 4. By completely emptying cell 2 of its contents, no drop from the melt in the cell 2 will be able to be transferred by the substrate 17 to the melt in cell 3 and thus contaminate it.

Figure 4:
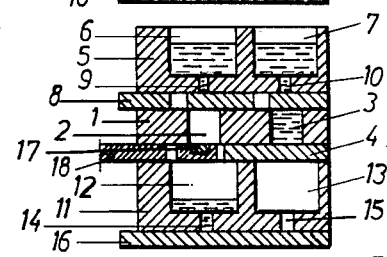
Figure 5:
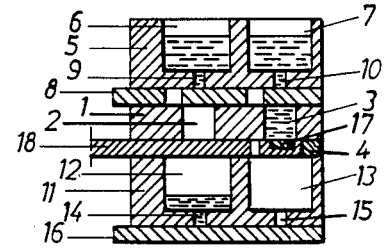

After cell 2 has been emptied in the manner indicated in FIG. 4, the substrate 17 is displaced by the holder 18 for growth of a new epitaxial layer in contact with the melt in cell 3 in the holder 1, in the manner indicated in FIG. 5. Growth in contact with the melt in cell 3 takes place during the time required for a layer of desired thickness to be obtained.

As a safety measure there is a through hole 19 on the substrate holder, this hole being arranged directly behind the substrate 17. If the operator forgets to withdraw the holder 18 before it is displaced further, the melt, in which growth has just taken place will be tapped through the hole 19. The melt in cell 3 in the holder 1 is then tapped off in the same way as illustrated in FIG. 4 in relation to the melt in cell 2 in the holder 1, whereafter the procedure is repeated until growth has taken place in contact with all melts in the holder 1.

By emptying all cells in the holder 1 in turn after growth of the respective epitaxial layer has taken place, the substrate can be withdrawn together with the displaceable bottom of the holder 1 to the initial position for the bottom 4 illustrated in FIG. 1.

As soon as the substrate 17 has been taken out, growth of a new substrate can be begun as soon as the cells in the melt holder have once again been filled with new one-phase melts from the compartments 6 and 7 in the melt filler 5.

Growth of new substrates can take place right up until the condition that the contents in the compartments in the filler 5 are not sufficient to fill the cells in the melt holder 1 with new one-phase melts.

When the contents in the compartments of the melt filler 5 have been moved down into the compartments in the melt collector 11, the melt collector 11 is quite simply allowed to change places with the melt filler 5, a new heating sequence being started before growth of a new set of substrates can take place.

With the apparatus in accordance with the invention it will thus be possible to maintain a more or less continuous production of grown substrates.

What is claimed is:

1. Apparatus for carrying out liquid phase epitaxy growth comprising a melt holder having a predetermined number of cells, each for receiving a melt, for growing on a horizontally disposed substrate a number of epitaxial layers corresponding to the number of melts, a displaceable substrate holder disposed under the melt holder and supporting said substrate to bring the substrate successively in contact with respective melts, a melt filler disposed above said melt holder and having a number of compartments corresponding to the number of cells of the melt holder, said compartments being of greater volume than that of the cells for storing batches in the compartments corresponding to several melts in the cells, a perforated plate disposed between the melt filler and the melt holder for controlling communication between said compartment and the respective cells, said plate being displaceable to a position to bring its perforations into communication with said compartments and with said cells for filling of said cells from said compartments, and a melt collector under said melt holder, said melt collector including a number of compartments corresponding to the number of cells in said holder for receiving melt from said cells, said melt holder and perforated plate being disposed between said melt filler and said melt collector, said melt holder including a bottom which is displaceable by said substrate holder, said compartments in said melt collector being of greater volume than that of said cells for collecting several melts from respective cells, said substrate holder being displaceable forwardly to bring the substrate successively into contact with the respective melts and also being displaceable backwardly a distance, after growth has taken place in contact with each melt, to form an intermediate space between said substrate holder and said displaceable bottom of the melt holder through which space the respective melt can flow into the associated compartment in said melt collector before the substrate holder is displaced forwardly to bring the substrate under the next melt in the melt holder, said melt filler and melt collector being substantially identical so that after the melt filler is emptied, it can be interchanged with the melt collector for substantially immediately repeating the epitaxy growth process.

2. Apparatus as claimed in claim 1 wherein said substrate holder has a hole therein behind the substrate.

3. Apparatus as claimed in claim 1 wherein said melt filler has bottom tap holes for each of said compartments in said filler.

4. Apparatus as claimed in claim 1 wherein said bottom of said melt holder is slidably displaceable by said substrate holder by abutment of the substrate holder against the bottom of the melt holder.

* * * * *